(12) United States Patent
Shigeta et al.

(10) Patent No.: US 7,413,989 B2
(45) Date of Patent: Aug. 19, 2008

(54) METHOD OF MANUFACTURING SEMICONDUCTOR DEVICE

(75) Inventors: Atsushi Shigeta, Fujisawa (JP);
Kazuhiko Ida, Yokohama (JP);
Yoshitaka Matsui, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 774 days.

(21) Appl. No.: 10/944,866

(22) Filed: Sep. 21, 2004

(65) Prior Publication Data

US 2005/0176253 A1    Aug. 11, 2005

(30) Foreign Application Priority Data

Feb. 5, 2004    (JP) .............................. 2004-029552

(51) Int. Cl.
*H01L 21/302* (2006.01)

(52) U.S. Cl. ................ 438/692; 438/633; 257/E21.304

(58) Field of Classification Search ................ 438/633, 438/690–693; 257/E21.23, E21.304
See application file for complete search history.

(56) References Cited

U.S. PATENT DOCUMENTS 5,980,775 A * 11/1999 Grumbine et al. .......... 252/79.1

6,316,366 B1    11/2001 Kaufman et al.
2003/0087590 A1    5/2003 Yang et al.

FOREIGN PATENT DOCUMENTS

| JP | 10-242090 | 9/1998 |
|----|-----------|--------|
| JP | 11-176777 | 7/1999 |
| JP | 2000-091277 | 3/2000 |
| JP | 2003-77919 | 3/2003 |

OTHER PUBLICATIONS

Notification of Reasons for Rejection in copending Japanese Application No. 2004-029552 and English translation thereof.
First Office Action in copending Chinese Patent Application No. 200510007566.8 and English translation thereof.

* cited by examiner

*Primary Examiner*—Thanhha Pham
(74) *Attorney, Agent, or Firm*—Finnegan, Henderson, Farabow, Garrett & Dunner, L.L.P.

(57) ABSTRACT

A semiconductor wafer including an underlying layer including an insulating film having at least one recess therein and a metallic material layer formed over a top surface of the underlying layer and filling the recess, on a semiconductor substrate, is subjected to a polishing treatment while supplying a basic CMP slurry containing metal ions on the semiconductor wafer to at least partially remove the metallic material layer. Then, an organic acid which chelates the metal ions is added to the basic CMP slurry, and polishing is conducted, using the organic acid-added CMP slurry, until a surface of the insulating film is exposed.

19 Claims, 4 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2004-029552, filed Feb. 5, 2004, the entire contents of which are incorporated herein by reference.

BACKGROUND OF THE INVENTION

1. Field of the Invention

The present invention relates to a method of manufacturing a semiconductor device, and more specifically, to a method of manufacturing a semiconductor device, which includes a polishing treatment using a CMP (chemical mechanical polishing) slurry.

2. Description of the Related Art

For manufacturing ultra-large scale integrated circuits, there is a recent trend of increasing the packaging or mounting density by reducing the size of transistors and other semiconductor elements. To this end, various fine processing techniques have been studied and developed, and according to the current design rules, the downsizing of elements has made such a progress to achieve sub-micron orders.

One of the techniques that have been developed to satisfy such tight downsizing demands is the CMP technique. This technique is an indispensable technique for, for example, the formation of buried metal wires, the planarization of interlayer insulating films, and the formation of connection plugs, buried isolations and buried capacitors in the manufacture of a semiconductor device.

In the CMP technique, a CMP slurry containing polishing grains is supplied on the surface of a semiconductor wafer and the surface of the wafer is slid on a polishing pad while the wafer surface is pressed against the pad, thereby chemically and mechanically polishing the wafer surface. For example, recesses (such as wiring grooves, via holes or contact holes) are formed in an insulating film formed on a semiconductor substrate. A metallic material layer is formed, filling the recesses and covering the surface of the insulating film, and then the metallic material layer is removed by the CMP until the underlying insulating film is exposed. In this manner, an electrically conductive layers (such as wiring layers or plugs) can be formed which remain (or are buried) in the recess portion. In this case, excessive polishing is required in order to avoid remnants of the metallic material after the polishing, which are caused by the in-plain or wafer-to-wafer variations in the rate of polishing by the CMP slurry. However, the excessive polishing creates dishing or erosion. The dishing or erosion may cause failure such as short-circuiting between wirings formed later.

To suppress dishing or erosion, U.S. Pat. No. 6,316,366 B1 discloses a CMP slurry which contains abrasive grains, two types of special oxidizing agents (urea hydrogen peroxide and dipersulfate or monopersulfate), and optionally an organic acid. This CMP slurry is used to polish a multi-layered metal in one step. Jpn. Pat. Appln. KOKAI Publication No. 2003-77919 discloses, in forming buried metallic wirings, removing a conductive material layer with a first polishing slurry halfway on one polishing platen (station), and then polishing the remaining conductive material layer with a second polishing slurry on another polishing platen until the underlying barrier film is exposed. Finally, the conductive material layer and the barrier layer are polished on still another polishing platen until the insulating film is exposed. The KOKAI Publication No. 2003-77919 discloses an aqueous slurry of colloidal silica or fumed silica, containing glycin or citric acid, and benzotriazole (BTA) and hydrogen peroxide, as a polishing slurry which can suppress erosion or dishing.

BRIEF SUMMARY OF THE INVENTION

According to an aspect of the present invention, there is provided a method of manufacturing a semiconductor device, comprising subjecting a semiconductor wafer comprising an underlying layer including an insulating film having at least one recess therein and a metallic material layer formed over a top surface of the underlying layer and filling the recess, on a semiconductor substrate, to a polishing treatment while supplying a basic CMP slurry containing metal ions on the semiconductor wafer to at least partially remove the metallic material layer; and then adding an organic acid which chelates the metal ions to the basic CMP slurry, and conducting polishing, using the organic acid-added CMP slurry, until a surface of the insulating film is exposed.

According to another aspect of the present invention, there is provided a method of manufacturing a semiconductor device, comprising: subjecting, on a polishing station, a semiconductor wafer comprising an underlying layer including an insulating film having at least one recess therein and a metallic material layer formed over a top surface of the underlying layer and filling the recess, on a semiconductor substrate, to a polishing treatment while supplying an organic acid-added CMP slurry comprising a basic CMP slurry containing metal ions to which an organic acid is added onto the semiconductor wafer until a surface of the insulating film is exposed; and then stopping the supply of the basic CMP slurry, and washing, on the polishing station, the polished surface of the semiconductor wafer while supplying the organic acid to the polished surface of the semiconductor wafer.

DETAILED DESCRIPTION OF THE INVENTION

Figure 1A:
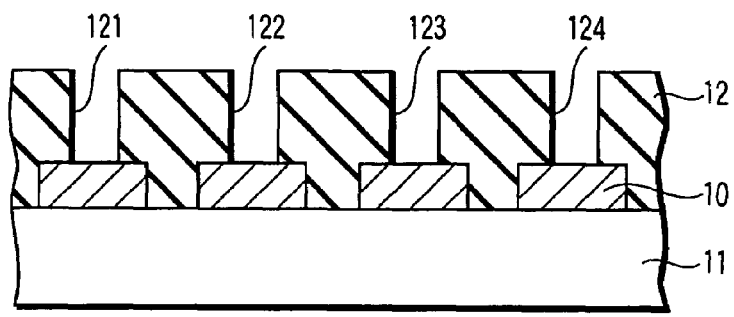
FIGS. 1A to 1E are schematic cross-sectional views for explaining a method of manufacturing a semiconductor device having buried plugs according to an embodiment of the present invention.

In an aspect of the present invention, the inventors of the present invention have found that when a layer of a metallic material such as tungsten (W), which is buried in a recess portion (for example, a wiring groove (trench), via hole and/or contact hole) formed in an underlying layer, including an insulating layer, formed on a semiconductor substrate, and which is formed also over the top surface of the underlying layer, is subjected to a CMP polishing, the metallic material layer can be polished relatively efficiently if the CMP slurry used contains metallic ions such as iron ions, but the erosion or dishing occurs to a large extent if the underlying layer is polished with the metal ion-containing CMP slurry. The inventors have further found that the erosion or dishing of the underlying layer can be significantly suppressed by adding an organic acid to a CMP slurry used.

In an embodiment of the present invention, a CMP slurry used to chemically and mechanically polish at least a portion of a metallic material layer (to be called basic CMP slurry hereinafter) is an aqueous slurry which contains abrasive grains and metal ions. As the abrasive grains, silica grains or alumina grains can be used. Further, the metal ions may be iron ions. The metal ions are contained in the basic CMP slurry usually in the form of a metal salt of an inorganic acid or organic acid. Examples of the metal salt of the inorganic acid include iron nitrate, iron chloride, iron sulfate, iron perchlorate and iron ammonium sulfate. Examples of the metal salt of the organic acid include iron citrate, iron ammonium citrate and iron lactate. The metal salt of the inorganic acid or organic acid serves as an oxidizing agent, and in some cases, it can serve as an oxidization promoter. The basic CMP slurry can contain the metal salt of the inorganic acid or organic acid in an amount of 0.01% to 10% by weight. If the amount of the metal salt of the inorganic or organic acid is too small, it is difficult to achieve a high polishing rate for the metallic material layer, thus decreasing the productivity. On the other hand, if the amount of the metal salt of the inorganic or organic acid is too large, the polishing rate of the metallic material layer cannot be further increased, thus resulting in the increase in the amount of consumption of the metal salt of the inorganic or organic acid.

The basic CMP slurry may contain, in addition to the above-mentioned components, hydrogen peroxide. The basic CMP slurry may contain hydrogen peroxide in an amount of 0.1% to 50% by weight. The basic CMP slurry may not contain an organic acid. However, it may contain a small amount (for example, 0.2 to 1% by weight in one embodiment, or 0.2 to 0.4% by weight in another embodiment) of organic acid (for example, the organic acid mentioned above) as a stabilizing agent for the CMP slurry. Usually the basic CMP slurry does not contain urea.

In one embodiment of the present invention, the organic acid added to the basic CMP slurry after removing at least a portion of the metallic material layer by polishing with the basic CMP slurry chelates the metal ions contained in the basic CMP slurry. Examples of the organic acid include carboxylic acids. In one embodiment, an aliphatic carboxylic acid such as citric acid or oxalic acid can be used.

In one embodiment of the present invention, the underlying layer includes a barrier layer formed over the inner surface of the recess portion and the top surface of the insulating layer. The barrier layer may be made of a barrier material such as titanium or titanium nitride, or it may be of a laminated structure of these materials. In the case where the underlying layer includes a barrier layer, the polishing with the basic CMP slurry can be carried out, for example, until at least a portion of the barrier layer is exposed. Then, the above-described organic acid is added to the basic CMP slurry, and the CMP treatment using the organic acid-added CMP slurry may be carried out until at least the surface of the insulating layer is exposed.

The organic acid, by chelating the metal ions contained in the basic CMP slurry, decreases the polishing rate of the metallic material with the basic CMP slurry, making the polishing rate of the metal material close to the polishing rate of the barrier layer and insulating layer. Therefore, from the point of view of shortening the total polishing time, it is preferable that the polishing with the basic slurry is carried out until at least a portion of the underlying layer is exposed.

The amount of the organic acid added to the basic CMP slurry may be such that the polishing rate ratio of the metallic material layer/insulating layer with the resulting organic acid added CMP slurry becomes at least 0.5 or higher and 3 or less in one embodiment, or becomes 1 or higher and 2 or less in another embodiment. In the case where the underlying layer includes the barrier layer, the amount of the organic acid added may be such that the polishing rate ratio of the metallic material layer/barrier layer with the organic acid added CMP slurry becomes 2 or less in one embodiment, becomes 1 or less in another embodiment, or becomes 0.5 or less in still another embodiment, in addition to satisfying the polishing rate ratio of the metallic material layer/insulating layer mentioned above. Specifically, the amount of the organic acid in the organic acid-added CMP slurry may be 3 to 6% by weight in the case where, for example, the organic acid is oxalic acid.

In one embodiment of the present invention, the polishing may be carried out with the organic acid-added CMP slurry until at least the surface of the insulating film is exposed, and then the supply of the basic CMP slurry may be stopped. Then, the surface of the semiconductor device that has been subjected to the CMP treatment can be washed by supplying the organic acid alone. With this washing with the organic acid, it is possible to significantly prevent the metal ions, which are contained in the basis CMP slurry, from remaining on the surface of the semiconductor wafer. The removal of the metal ions with the organic acid is preferably carried out under an acidic environment brought about by the CMP slurry with the organic acid added thereto. In conventional techniques, after the completion of the CMP treatment at a polishing station before scrub washing at a washing station, the polished surface is rinsed with purified water (deionized water) in order to, for example, remove particles, eliminate contaminations and prevent drying. However, it has been found that when purified water is brought into contact with the polished surface after the completion of polishing with the organic acid-added CMP slurry, the polished surface is neutralized by the purified water, strengthening the bonding of the metal ions with the surface of the insulating film, which makes it difficult to remove the metal ions. For this reason, it is preferable that the washing (rinsing) treatment using purified water is not be carried out between the polishing treatment with the organic acid-added CMP slurry and the scrub washing treatment with an organic acid. More specifically, after the completion of the polishing with the organic acid-added CMP slurry, the scrub washing treatment with the organic acid can be carried out continuously at the same polishing station where the polishing has just been carried out. From the point of view of washing with the organic acid, there is provided, according to another aspect of the present invention, a method of manufacturing a semiconductor device, comprising: subjecting, on a polishing station, a semiconductor wafer comprising an underlying layer including an insulating film having at least one recess therein and a metallic material layer formed over a top surface of the underlying layer and filling the recess, on a semiconductor substrate, to a polishing treatment while supplying an organic acid-added CMP slurry comprising a basic CMP slurry containing metal ions to which an organic acid is added onto the semiconductor wafer until a surface of the insulating film is exposed; and then stopping the supply of the basic slurry, and washing, on the polishing station, the polished surface of the semiconductor wafer while supplying the organic acid to the polished surface of the semiconductor wafer.

FIGS. 1A to 1E are cross sections schematically illustrating a semiconductor device for explaining a method of manufacturing a semiconductor device having a buried wiring according to an embodiment of the present invention.

First, as illustrated in FIG. 1A, at least one via hole is formed in an insulating film 12 provided on a semiconductor substrate 11 made of a silicon substrate or the like, on which various semiconductor elements (not shown) and wires 10 are formed. In FIG. 1A, four via holes 121 to 124 are illustrated. The insulating film 12 can be made of silicon dioxide by using, for example, an ordinary CVD method. Alternatively, the insulating film 12 can be made of a low-k material, an inorganic insulating material, for example, fluorine-added silicon dioxide (SiOF), porous hydrogenated silsesquioxane spin on glass (HSQ-SOG), or an organic insulating material, for example, a fluorine resin such as polytetrafluoroethylene (PTFE), polyimide resin, fluorine-added polyimide resin or benzocyclobutene (BCB). The insulating film 12 can be formed to have a thickness of, for example, 100 nm to 1,000 nm.

Figure 1B:
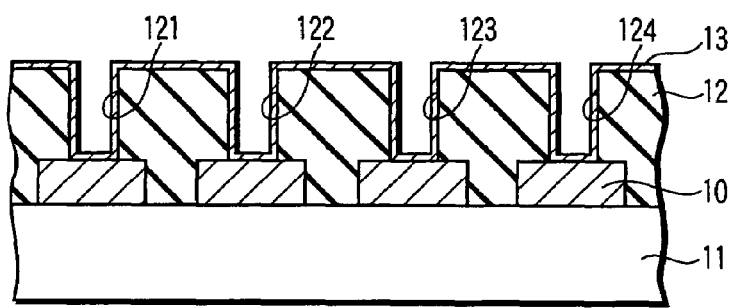

Subsequently, as illustrated in FIG. 1B, a barrier material layer 13 is formed on the surface of the insulating film 12 and the inner surfaces of the via holes 121 to 124. The barrier material layer 13 can be made of the above-mentioned barrier material using a PVD method such as an ordinary spattering method or vapor deposition method. The barrier material layer 13 may have a thickness of, for example, 5 nm to 70 nm.

Figure 1C:
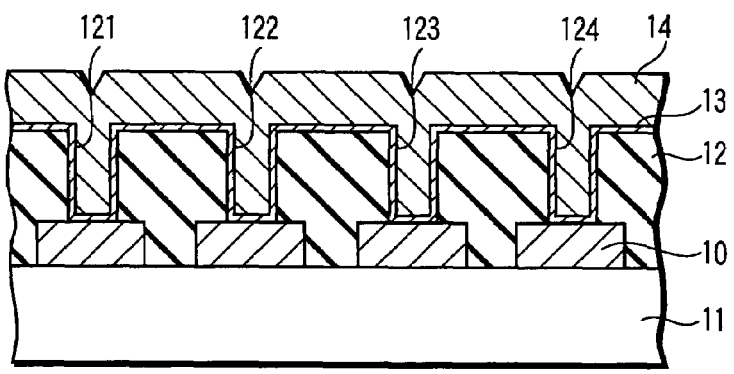
Figure 1D:
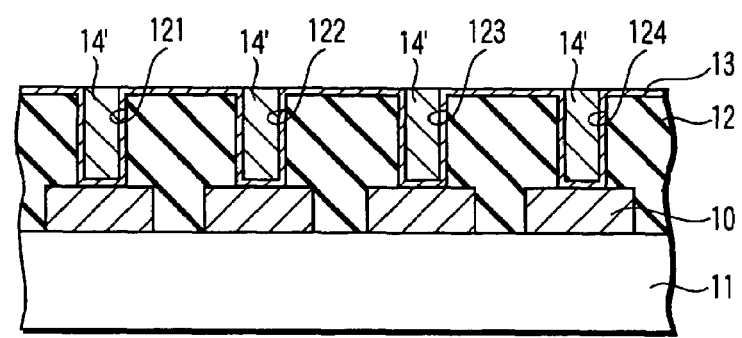

Then, as illustrated in FIG. 1C, a plug material layer 14 as a metallic material layer is formed over the surface of the barrier material layer 13, filling the via holes 121 to 124. The plug material layer 14 can be formed of tungsten (W) by, for example, an ordinary CVD method. The plug material layer 14 may have a thickness (taken from the bottom surface of a via hole to the upper surface) of, for example, 100 nm to 1,000 nm.

Next, the semiconductor wafer structure illustrated in FIG. 1C is subjected to a CMP treatment. In this CMP treatment, first, while supplying the basic CMP slurry described above, the plug material layer 14 is polished in its thickness direction until at least a portion of the surface of that portion of the underlying barrier material layer 13 which is situated outside the via holes is exposed. (See FIG. 1D.) Thus, the plug material 14' remains in the via holes.

Figure 1E:
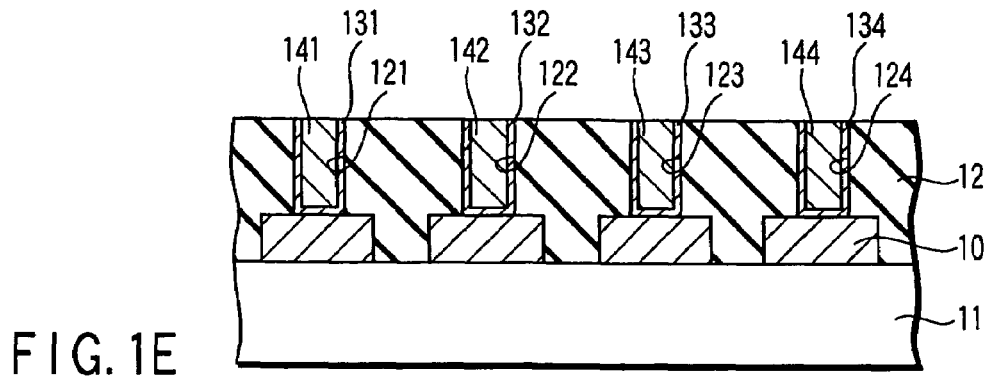

Thereafter, the acid described above is added to the basic CMP slurry. Using this organic acid-added CMP slurry, the barrier material layer 13 on the insulating film 12 except for the insides of the via holes, as well as the surface portion of the remaining plug material 14' (see FIG. 1D) are removed by polishing. In this manner, plugs 141 to 144 are obtained as illustrated in FIG. 1E in such a form that they are buried in the via holes 121 to 124 through the barrier films 131 to 134, respectively.

Next, the supply of the basic CMP slurry is stopped, and while supplying only the organic acid, the surface of the polished semiconductor wafer can be washed. Thus, the metal ions which might remain on the semiconductor wafer can be removed.

Figure 2:
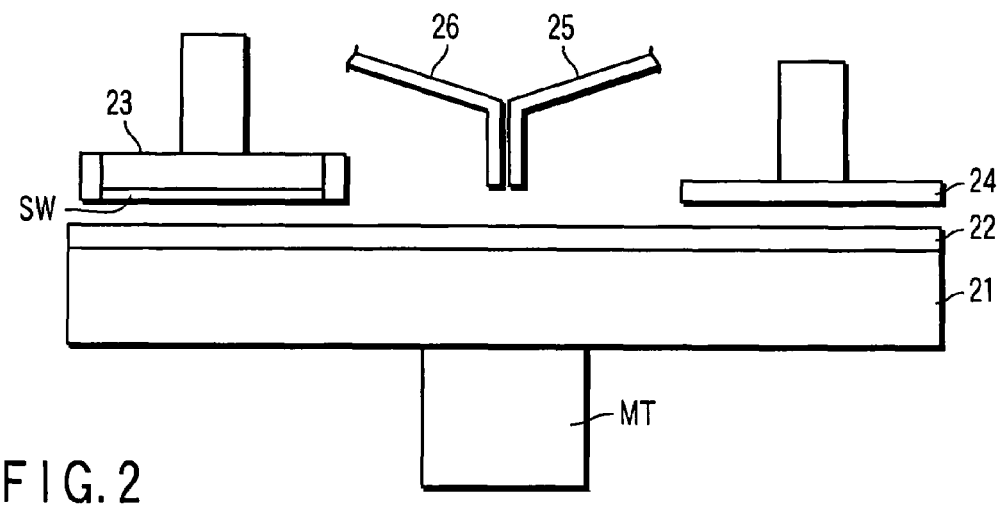
FIG. 2 is a schematic view illustrating a CMP apparatus which can be used in an embodiment of the present invention.

In one embodiment of the present invention, the two-stage treatment of the CMP treatment and washing treatment can be carried out continuously, using a CMP apparatus having a structure schematically illustrated in FIG. 2. The CMP apparatus may have a construction similar to that of an ordinary CMP apparatus except that it is equipped with a supply mechanism of organic acid, which will be later explained.

The CMP apparatus illustrated in FIG. 2 includes a circular disk polishing platen (station) 21 which can be rotated by a rotating device a motor MT, not illustrated. A polishing pad 22 is adhered to the platen 21. The polishing pad 22 can be made of, for example, a polyurethane foam.

Above the radial region of the platen 21, for example, a vacuum chuck holder 23 which holds a semiconductor wafer SW with a vacuum chuck is provided. The semiconductor wafer SW is held such that the surface to be polished faces the polishing pad 22. The vacuum chuck holder 23 is designed to be not only rockable, but also rotatable around its rotation shaft and liftable by means of a motor and a lifting cylinder (both not illustrated) coupled to the rotation shaft. The pressure which presses the semiconductor wafer SW on the polishing pad 22 is controlled by the compression air used to drive the lifting cylinder. On the opposite side to the vacuum chuck holder 23 with respect to the central shaft of the platen 21, a dresser (conditioner) 24 constructed by a rotatable circular disk plate, having diamonds (not illustrated) attached to its surface by electrodeposition, is provided.

Further, above the center region of the polishing pad 22, a polishing slurry supply pipe 25 and an organic acid supply pipe 26 are provided. One end of the polishing slurry supply pipe 25 is connected to a supply source (not shown) of the basic CMP slurry, and the other end of the pipe 25 is extended to a position close to the polishing pad 22. One end of the organic acid supply pipe 26 is connected to a supply source (not shown) of the organic acid and the other end (organic acid discharge outlet) of the pipe 26 is extended to a position close to the polishing pad 22. The supply pipes 25 and 26 are each provided with a flow control valve (not illustrated).

In the CMP treatment, the semiconductor wafer SW is held by the vacuum chuck holder 23 and the surface of the wafer SW to be polished is pressed against the polishing pad 22. With the flow control valve of the supply pipe 26 closed, the flow control valve of the supply pipe 25 is opened to supply the basic CMP slurry onto the polishing pad 22, during which the platen 21 and vacuum chuck holder 23 (hence, the semiconductor wafer SW) are rotated. Usually, the pressure applied on the semiconductor wafer SW (polishing pressure) may be 100 to 500 hPa, the number of rotations of the holder may be 20 to 120 rpm, the number of revolutions of the platen may be 20 to 120 rpm, and the flow rate of the supply of the CMP slurry may be 50 to 500 mL/min. When the polishing with the basic CMP slurry carried out in this way is finished, the flow control valve of the supply pipe 26 is opened to supply the organic acid onto the polishing pad 22, together with the basic CMP slurry, with the polishing continued. When the polishing with the organic acid-added CMP slurry is finished, the flow control valve of the supply pipe 25 is closed to stop the supply of the basic CMP slurry. Thus, while supply the organic acid alone onto the polishing pad 22, the washing treatment is carried out. In this manner, the CMP treatment and the washing treatment can be carried out on one platen.

EXAMPLE 1

Figure 3A:
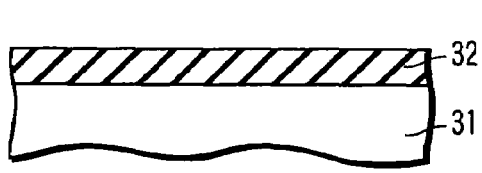
FIGS. 3A to 3C are schematic cross-sectional views illustrating semiconductor wafer samples used in Example 1 described later.
Figure 3B:
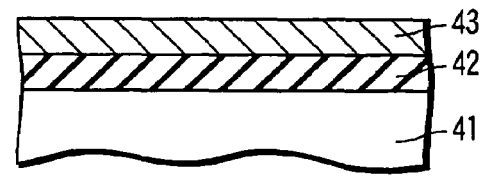
Figure 3C:
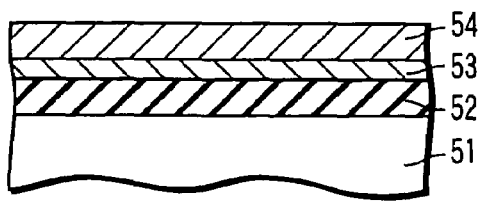

In this Example, there were prepared a sample A of a silicon substrate 31 on which a silicon dioxide film 32 has been formed by a CVD method as illustrated in FIG. 3A, a sample B of a silicon substrate 41 on which a silicon dioxide film 42 has been formed on by a CVD method and a titanium barrier film 43 has been formed thereon by a PVD method as illustrated in FIG. 3B, and a sample C of a silicon substrate 51 on which a silicon dioxide film 52 has been formed on by a CVD method, a titanium/titanium nitride barrier film 53 has been formed thereon by a PVD method and a tungsten film 54 has been formed thereon by a CVD method as illustrated in FIG. 3C.

The top layer of each of the samples A to C was polished on the CMP apparatus having the construction illustrated in FIG. 2 with a basic CMP slurry (slurry I) containing 5% by weight of silica grains, 0.05% by weight of ferric nitrate, 4% by weight of hydrogen peroxide and the balance of deionized water, a CMP slurry (slurry II) prepared by adding oxalic acid to the slurry I in an amount of 2% by weight, a CMP slurry (slurry III) prepared by adding oxalic acid to the slurry I in an amount of 4% by weight, and a CMP slurry (slurry IV) prepared by adding citric acid to the slurry I in an amount of 16% by weight. The polishing treatments were carried out under the following conditions: a polishing pressure of 200 hPa, the number of rotations of each of the polishing platen and vacuum chuck holder of 50 rpm, and the amount of supply of the basic CMP slurry of 200 mL/min. A polyurethane foam pad was used as the polishing pad.

Figure 4:
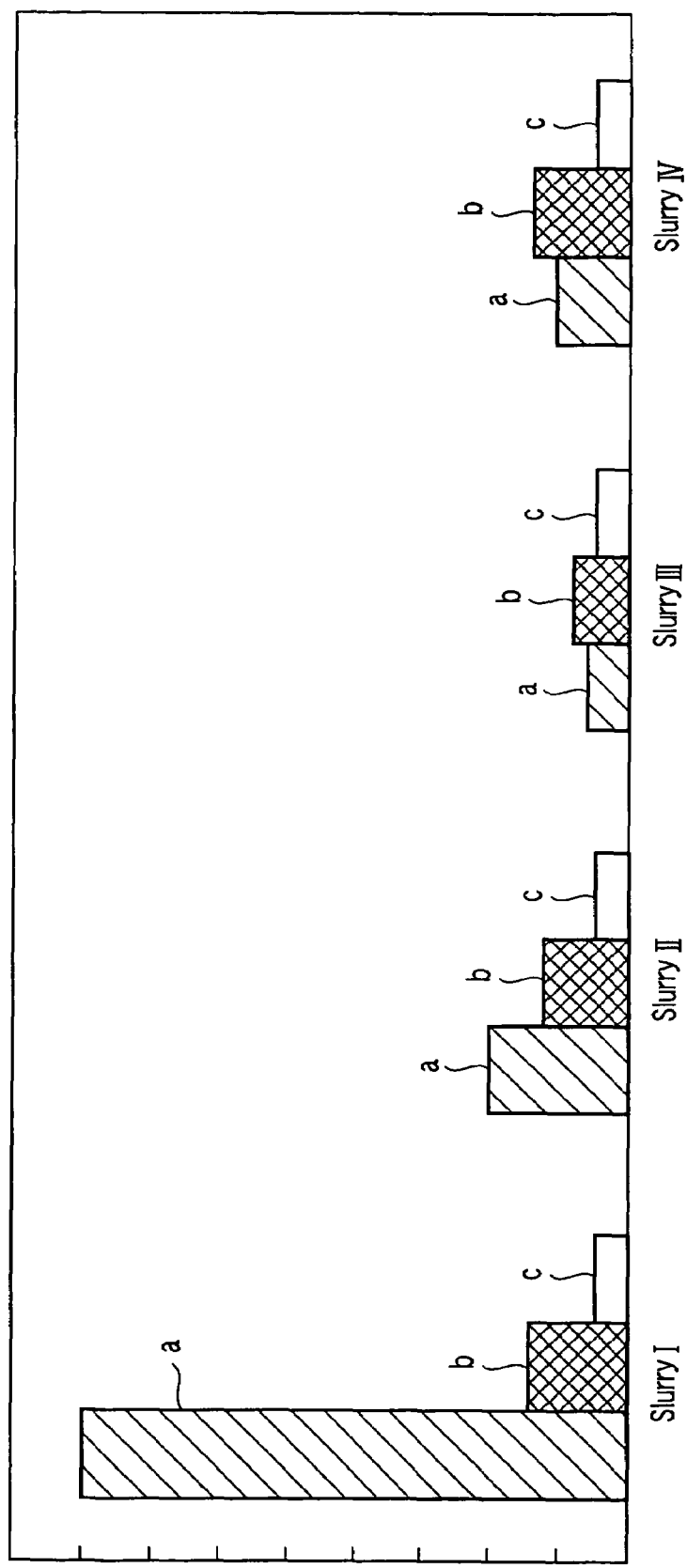
FIG. 4 is a graph illustrating relative polishing rates of tungsten, titanium and silicon dioxide by various slurries.

After the polishing was carried out for a prescribed time under the conditions noted above, the remaining amount of each of the tungsten film (sample C), the barrier film (sample B) and the silicon dioxide film (sample A) was measured. Then, from the difference in film thickness between before and after the polishing, the polishing rate for each of the tungsten film, the barrier film and the silicon dioxide film was calculated. In this case, a sheet resistance measuring device was used to measure the thickness of the tungsten film, an X ray fluorescence measuring device was used to measure the thickness of the barrier film and a light interference film thickness measuring device was used to measure the thickness of the silicon dioxide film. The results are illustrated in FIG. 4. In FIG. 4, bars denoted by symbol a indicate the results regarding the tungsten film, bars denoted by symbol b indicate the results regarding the barrier film (titanium film), and bars denoted by symbol c indicate the results regarding the silicon dioxide film.

From the results illustrated in FIG. 4, it can be seen that although the basic CMP slurry (slurry I), which contains iron ions but does not contain a chelating agent such as an organic acid, provides a significantly high polishing rate of the tungsten film, the polishing rate of the tungsten film is greatly decreased to become close to the polishing rate of the barrier layer or the silicon dioxide layer when the organic acid is added to the basic slurry. Further, it can be seen that the ratio in the polishing rate ratio of the tungsten film/barrier film, the polishing rate ratio of the tungsten film/silicon dioxide film, and the polishing rate ratio of the barrier film/silicon dioxide film can be appropriately controlled by adjusting the amount of the organic acid added.

EXAMPLE 2

In this Example, a semiconductor wafer having the structure illustrated in FIG. 1C was prepared. More specifically, a silicon dioxide film as the insulating film 12 was formed to a thickness of 600 nm by the CVD method on the silicon substrate 11, on which wires 10 have been provided. As the barrier layer 13, a titanium/titanium nitride laminate in which the titanium film had a thickness of 30 nm and the titanium nitride film had a thickness of 5 nm was formed by the PVD method. As the metallic material layer 14, a tungsten layer was formed by the CVD method to a thickness of 400 nm (which is taken from the bottom of the via holes 121 to 124 to the top surface).

Next, the semiconductor wafer was subjected to a CMP treatment on the CMP apparatus illustrated in FIG. 2. The basic CMP slurry used contained 5% by weight of silica grains, 0.05% by weight of ferric nitrate, 4% by weight of hydrogen peroxide and the balance of deionized water. The polishing conditions and polishing pad were the same as those in Example 1.

First, using the basic slurry alone, the tungsten layer 14 was removed by polishing until a portion of the surface of the barrier layer 13 just became exposed. Then, oxalic acid was added to the basic slurry in an amount to have 4% by weight in the basic slurry, and using the oxalic acid-added slurry, the remaining tungsten layer portion and the barrier layer portion that was present outside the via holes and on the silicon dioxide layer were removed by polishing, thereby exposing the top surface of the silicon dioxide layer.

Figure 5:
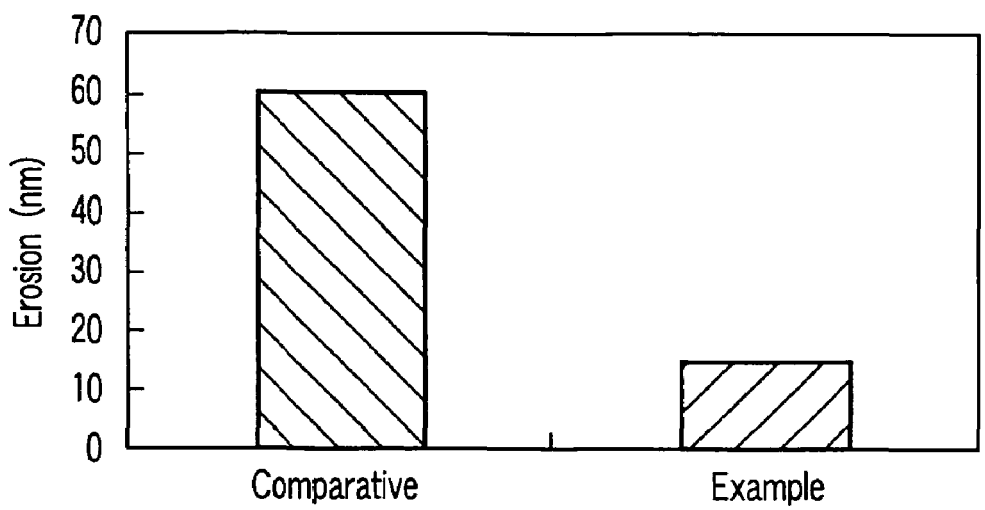
FIG. 5 is a graph illustrating erosion of a semiconductor wafer polished in Example 2, along with that of a Comparative Example.

After the completion of the polishing, the erosion of the polished surface of the semiconductor wafer was measured, using a contact-type profilometer. The results are illustrated in FIG. 5. FIG. 5 also shows the results of the case where only the basic slurry was used to remove the tungsten layer and barrier layer by polishing.

As can be seen from the results in FIG. 5, the erosion can be significantly reduced by adding the organic acid to the basic CMP slurry after exposing a part of the surface of the barrier film.

EXAMPLE 3

In this Example, a semiconductor wafer having the structure illustrated in FIG. 3C except that the barrier layer 53 was formed of titanium was prepared.

This semiconductor wafer was subjected to a CMP treatment on the CMP apparatus illustrated in FIG. 2. The basic CMP slurry used contained 3% by weight of silica grains, 4% by weight of ferric nitrate, and the balance of deionized water. The polishing conditions and polishing pad were the same as those of Example 1.

First, using the basic slurry alone, the tungsten layer 54 was removed by polishing until a part of the surface of the barrier layer 53 just became exposed. Then, citric acid was added to the basic slurry in an amount to have an amount of 5% by weight in the basic slurry. Using the citric acid-added slurry, the remaining tungsten layer 54 and the barrier layer 53 were removed by polishing, thereby exposing the top surface of the silicon dioxide layer 52. Lastly, the supply of the basic CMP slurry was stopped, and while supplying citric acid alone, the washing is carried out with the surface of the polished semiconductor wafer was slid against the polishing pad under a pressure. After the washing, all the silicon dioxide film on the silicon substrate was dissolved and collected. Then, the amount of iron was quantitatively analyzed using an atomic absorption spectrometry.

Figure 6:
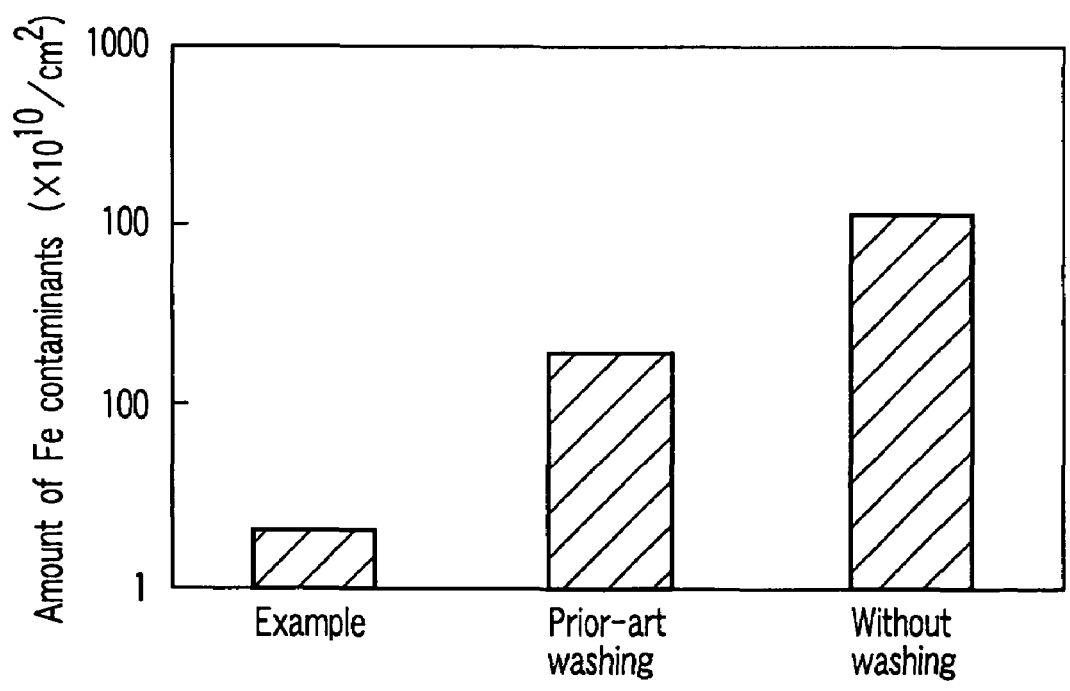
FIG. 6 is a graph illustrating an amount of iron ions remaining on the surface of a semiconductor wafer after washing carried out following polishing in Example 3, along with the cases of a prior art washing and without washing.

The results are illustrated in FIG. 6. FIG. 6 also illustrates the results of the case of the conventional washing treatment in which the scrub washing was carried out using an organic acid in a washing station after washing by sliding the wafer on the polishing pad while supplying deionized water, as well as the case where the washing with citric acid was not carried out. As can be seen from the results illustrated in FIG. 6, when the wafer is washed while supplying an organic acid alone subsequent to the CMP treatment, the contamination with metal ions can be significantly reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

subjecting a semiconductor wafer comprising an underlying layer including an insulating film having at least one recess therein and a metallic material layer formed over a top surface of the underlying layer and filling the recess, on a semiconductor substrate, to a polishing treatment while supplying a basic CMP slurry containing metal ions on the semiconductor wafer to at least partially remove the metallic material layer; and then adding an organic acid which chelates the metal ions to the basic CMP slurry, and conducting polishing, using the organic acid-added CMP slurry, until a surface of the insulating film is exposed, wherein the supply of the basic CMP slurry is stopped after completion of the polishing, and the polished surface of the semiconductor wafer is washed while supplying the organic acid to the polished surface of the semiconductor wafer.

2. The method according to claim 1, wherein the metallic material layer comprises tungsten.

3. The method according to claim 1, wherein the underlying layer includes a barrier layer formed on an inner surface of the at least one recess and over a top surface of the insulating film.

4. The method according to claim 1, wherein the metal ions comprise iron ions.

5. The method according to claim 4, wherein the iron ions are contained in the CMP slurry in a form of an organic acid salt or an inorganic acid salt of iron.

6. The method according to claim 1, wherein the organic acid is selected from the group consisting of oxalic acid and citric acid.

7. The method according to claim 1, wherein the organic acid is added to the basic CMP slurry in such an amount that a ratio of a polishing rate of the metallic material layer to a polishing rate of the insulating film is 0.5 or more and 3 or less.

8. The method according to claim 3, wherein the organic acid is added to the basic CMP slurry in such an amount that a ratio of a polishing rate of the metallic material layer to a polishing rate of the insulating film is 0.5 or more and 3 or less, and a ratio of a polishing rate of the metallic material layer to a polishing rate of the barrier layer is 2 or less.

9. The method according to claim 1, wherein the polishing and the washing are carried out on a same station.

10. The method according to claim 1, wherein the washing is carried out after the polishing without rinsing of the polished surface with water conducted between the polishing and the washing.

11. A method of manufacturing a semiconductor device, comprising:

subjecting, on a polishing station, a semiconductor wafer comprising an underlying layer including an insulating film having at least one recess therein and a metallic material layer formed over a top surface of the underlying layer and filling the recess, on a semiconductor substrate, to a polishing treatment while supplying an organic acid-added CMP slurry comprising a basic CMP slurry containing metal ions to which an organic acid is added onto the semiconductor wafer until a surface of the insulating film is exposed; and then stopping the supply of the basic CMP slurry, and washing, on the polishing station, the polished surface of the semiconductor wafer while supplying the organic acid to the polished surface of the semiconductor wafer.

12. The method according to claim 11, wherein the metallic material layer comprises tungsten.

13. The method according to claim 11, wherein the underlying layer includes a barrier layer formed on an inner surface of the at least one recess and over a top surface of the insulating film.

14. The method according to claim 11, wherein the metal ions comprise iron ions.

15. The method according to claim 14, wherein the iron ions are contained in the CMP slurry in a form of an organic acid salt or an inorganic acid salt of iron.

16. The method according to claim 11, wherein the organic acid is selected from the group consisting of oxalic acid and citric acid.

17. The method according to claim 11, wherein the organic acid is added to the basic CMP slurry in such an amount that a ratio of a polishing rate of the metallic material layer to a polishing rate of the insulating film is 0.5 or more and 3 or less.

18. The method according to claim 13, wherein the organic acid is added to the basic CMP slurry in such an amount that a ratio of a polishing rate of the metallic material layer to a polishing rate of the insulating film is 0.5 or more and 3 or less, and a ratio of a polishing rate of the metallic material layer to a polishing rate of the barrier layer is 2 or less.

19. The method according to claim 11, wherein the washing is carried out after the polishing without rinsing of the polished surface with water conducted between the polishing and the washing.

* * * * *